United States Patent
Charpin-Nicolle

(10) Patent No.: US 7,923,177 B2
(45) Date of Patent: Apr. 12, 2011

(54) METHOD FOR MAKING A REFLECTION LITHOGRAPHIC MASK AND MASK OBTAINED BY SAID METHOD

(75) Inventor: Christelle Charpin-Nicolle, Fontanil-Cornillon (FR)

(73) Assignee: Commissariat a l'Energie Atomique (FR)

( * ) Notice: Subject to any disclaimer, the term of this patent is extended or adjusted under 35 U.S.C. 154(b) by 215 days.

(21) Appl. No.: 12/097,362

(22) PCT Filed: Dec. 4, 2006

(86) PCT No.: PCT/EP2006/069272
§ 371 (c)(1),
(2), (4) Date: Oct. 30, 2008

(87) PCT Pub. No.: WO2007/068617
PCT Pub. Date: Jun. 21, 2007

(65) Prior Publication Data
US 2009/0269678 A1 Oct. 29, 2009

(30) Foreign Application Priority Data
Dec. 13, 2005 (FR) ...................... 05 12611

(51) Int. Cl.
*G03F 1/00* (2006.01)
(52) U.S. Cl. .......................................... 430/5
(58) Field of Classification Search ............ 430/5, 270.1
See application file for complete search history.

(56) References Cited

U.S. PATENT DOCUMENTS

| 4,332,879 A | 6/1982 | Pastor et al. |
| 6,071,676 A * | 6/2000 | Thomson et al. ............. 430/311 |
| 6,171,757 B1 | 1/2001 | Angelopoulos et al. |
| 6,436,605 B1 | 8/2002 | Angelopoulos et al. |
| 2003/0000921 A1 * | 1/2003 | Liang et al. .................... 216/59 |

OTHER PUBLICATIONS

Seitz, H. et al. "Recent Results on EUV Mask Blank Multilayers and Absorbers." Proceedings of the SPIE—The International Society for Optical Engineering SPIE-INT. Soc. Opt. Eng USA, vol. 5751, No. 1, Mar. 2005, pp. 209-218, XP002397456, ISSN: 0277-786X.
Davidson, M. R. et al. "Novel Route for the Production of X-ray Masks from a Range of Organometallic Films." Microelectronic Engineering Elsevier Publishers BV., Amsterdam, NL, vol. 41-42, Mar. 1998, pp. 277-282, XP004111680, ISSN: 0167-9317.
Bing, Lu et al. "EUV Radiation Damage Test on EUVL Mask Absorber Materials." Proceedings of the SPIE-The International Society for Optical Engineering SPIE-INT. Soc. Opt. Eng USA, vol. 5256, No. 1, 2003, pp. 1232-1238, XP002397457, ISSN: 0277-786X.

* cited by examiner

*Primary Examiner* — Jonathan Jelsma
(74) *Attorney, Agent, or Firm* — Lowe Hauptman Ham & Berner, LLP

(57) ABSTRACT

The invention relates to a process for fabricating an extreme ultraviolet photolithography mask operating in reflection, comprising a substrate, a mirror structure (uniformly deposited on the substrate, and an absorbent element forming a pattern deposited on the mirror structure, characterized in that the absorbent element is obtained by the irradiation and then development of an organometallic resist layer deposited on the mirror structure.

6 Claims, 1 Drawing Sheet

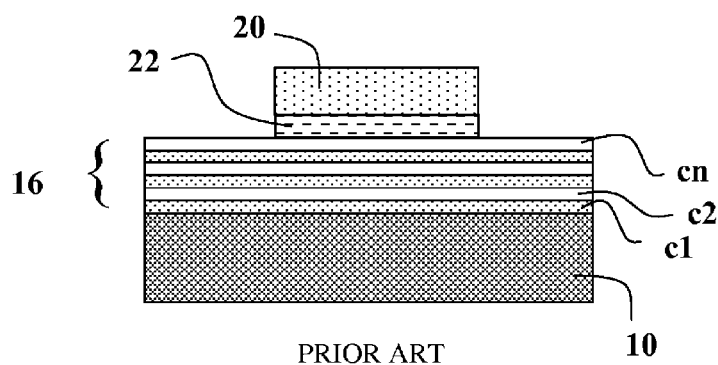
Fig. 1
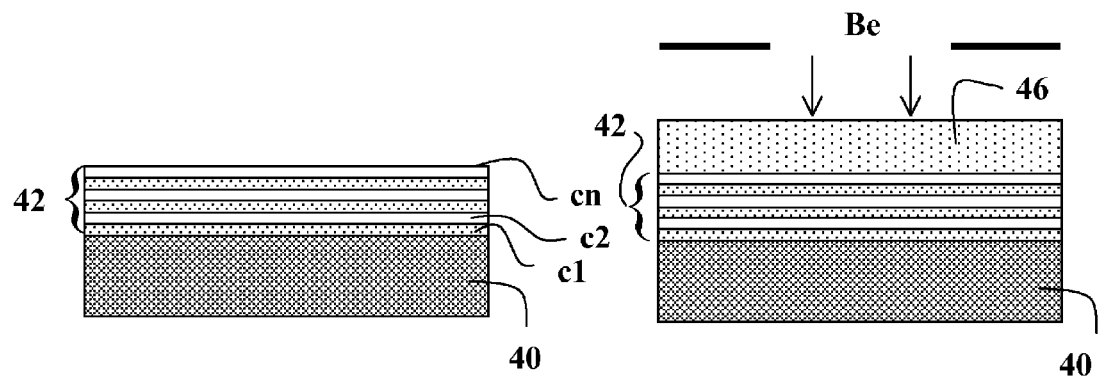
Fig. 2a  Fig. 2c
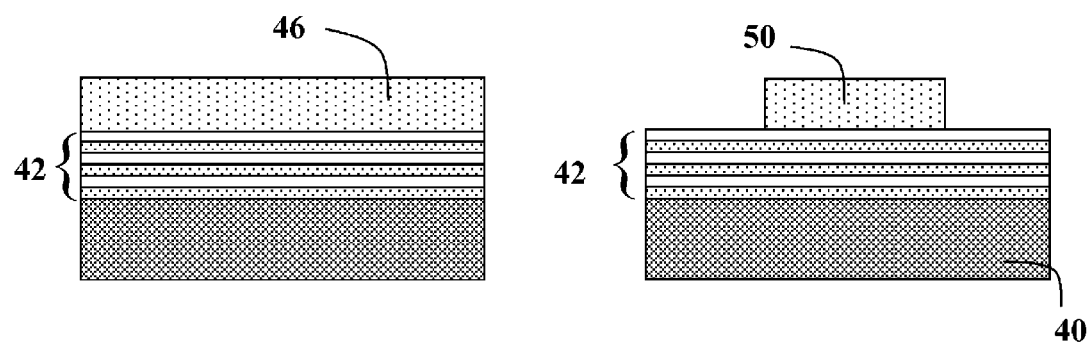
Fig. 2b  Fig. 2d

METHOD FOR MAKING A REFLECTION LITHOGRAPHIC MASK AND MASK OBTAINED BY SAID METHOD

CROSS-REFERENCE TO RELATED APPLICATIONS

The present Application is based on International Application No. PCT/EP2006/069272, filed on Dec. 4, 2006, which in turn corresponds to French Application No. 0512611, filed on Dec. 13, 2005, and priority is hereby claimed under 35 USC §119 based on these applications. Each of these applications are hereby incorporated by reference in their entirety into the present application.

FIELD OF THE INVENTION

The invention relates to photolithography, and notably to photolithography at very short wavelengths. It relates more precisely to a lithography mask structure intended for use in reflection and to a process for fabricating this mask structure.

BACKGROUND OF THE INVENTION

Photolithography is used to produce electronic optical or mechanical microstructures, or microstructures combining electronic and/or optical and/or mechanical functions. It consists in irradiating, with photon radiation, through a mask that defines the desired pattern, a photosensitive resist (or photoresist) layer deposited on a planar substrate (for example a silicon wafer). The chemical development that follows the irradiation reveals the desired patterns in the resist. The resist pattern thus etched may serve both for several usages, the most common being the etching of an underlying layer (whether insulating or conducting or semiconducting) so as to define therein a pattern identical to that of the resist.

It is sought to obtain extremely small and precise patterns and to align etched patterns very precisely in multiple superposed layers. Typically, the critical dimension of the desired patterns is nowadays a fraction of a micron, or even a tenth of a micron and below.

Attempts have been made to use lithographic processes not using light but electron or ion bombardment. These processes are more complex than photolithography processes using photons at various wavelengths (visible, ultraviolet, X-ray). Sticking to optical photolithography, it is the reduction in wavelength that allows the critical dimension of the patterns to be reduced.

Ultraviolet photolithography (at wavelengths down to 190 nanometers) has become commonplace.

It is endeavored at the present time to go well below these wavelengths and to work in extreme ultraviolet (EUV) at wavelengths between 10 and 14 nanometers which are in practice soft X-ray wavelengths. The objective is to obtain a very high resolution, while still maintaining a low numerical aperture and a sufficient depth of field (greater than one micron).

At such wavelengths, one particular aspect of the photolithography process is that the resist exposure mask operates in reflection and not in transmission: the extreme ultraviolet light is projected onto the mask by a source; the mask comprises absorbent zones and reflecting zones; in the reflecting zones, the mask reflects the light onto the resist to be exposed, impressing its image thereon. The path of the light between the mask and the resist to be exposed passes via other reflectors, the geometries of which are designed so as to project a reduced image of the mask and not a full-size image. The image reduction makes it possible to etch smaller patterns on the exposed resist than those etched on the mask.

The mask itself is fabricated by photo-etching a resist, this time in transmission, as will be explained later, and with a longer wavelength, permitted by the fact that the features are larger.

Typically, a reflection mask is made up of a planar substrate covered with a continuous reflecting structure, in practice a Bragg mirror structure being covered with an absorbent layer etched in the desired masking pattern.

The mirror must also be as reflective as possible at the working wavelength designed for the use of the mask. The absorbent layer must also be as absorbent as possible at this wavelength and must be deposited without causing deterioration of the reflecting structure, which notably implies deposition at not too high a temperature (below 150° C.). It must also be able to be etched without damaging the reflecting structure and in general a buffer layer is provided between the absorbent layer and the mirror. The height of the stack comprising the buffer layer and the absorbent layer must be as small as possible so as to minimize the shadowing effects when the radiation is not perfectly incident normal to the surface of the mask.

The known processes for fabricating EUV reflection masks are expensive owing to the large number of steps needed for the fabrication, and they often result in absorbent stacks of large height, and therefore having shadowing effects, especially because the temperature constraints prevent the use of sufficiently absorbent materials.

SUMMARY OF THE INVENTION

To alleviate the drawbacks of the known processes, the invention provides a process for fabricating an extreme ultraviolet photolithography mask operating in reflection, in which there is deposited, on a substrate coated with a reflecting structure, which is reflective at the operating wavelength of the mask, a layer containing a metal having a high absorption coefficient for this wavelength, and this absorbent layer is etched in a desired pattern so as to define a pattern of zones that are absorbent at the operating wavelength of the mask, characterized in that the deposited layer is a layer of an organometallic compound sensitive to bombardment and containing this metal, and in that the absorbent zones are formed by this organometallic compound polymerized after selective irradiation of the layer in these zones.

The expression "layer sensitive to bombardment" is understood to mean a layer sensitive either to photons (near-ultraviolet or far-ultraviolet, or even soft X-rays) or to particles (electrons or ions). The layer polymerizes under the effect of this bombardment. In the rest of the text, to simplify matters, the term "photosensitive layer" is used both for denoting a layer sensitive to photon bombardment and a layer sensitive to electron or ion bombardment, and the term "irradiation" will be used to denote both exposure to photons and exposure to electrons or ions.

Thus, it is the photosensitive layer itself which, after polymerization by selective irradiation, constitutes the absorbent zones of the mask, the mask being reflective outside these zones thanks to the reflecting structure formed on the substrate.

Under the effect of the selective irradiation, the layer is converted into an organometallic polymer—the absorbent metal constitutes one element of the polymeric chains. The choice of metal is dictated by its absorption properties at the extreme ultraviolet wavelength at which it is desired to use the mask.

It is unnecessary to deposit beneath the absorbent layer a buffer layer that protects the reflecting structure against the plasma etching of the absorbent layer, as is the case in the prior art. This is because the pattern of absorbent zones is obtained by simple chemical development of the photosensitive resist (or photoresist), this chemical development not attacking the reflecting structure.

Consequently, it is unnecessary to carry out the following succession of steps: deposition of a buffer layer; deposition of an absorbent layer; deposition of a photosensitive resist; irradiation of the resist; development of the resist; etching of the absorbent layer; removal of the resist; and etching of the buffer layer. All these steps are replaced by: deposition of a resist; irradiation of the resist; development of the resist. This fewer number of steps reduces the fabrication cost and is all the more favorable since the steps of etching the absorbent layer and the buffer layer are particularly tricky in the prior art.

In addition, certain absorbent metals that could not be used in the prior art can now be used. This is because, in the prior art it was necessary to be limited to metals that can be deposited at low temperature (below 150° C.) to avoid damaging the reflecting structure. For certain metals, deposited by sputtering, the deposition temperature is necessarily higher than this value, which would prevent their use. By incorporating these metals into an organic compound, they can be deposited at low temperature.

The preferred metals according to the invention are platinum, palladium, yttrium, hafnium, zirconium, iron, but also aluminum and titanium, or else several of these metals. All these metals have good absorption properties in the extreme ultraviolet and can be combined with certain photosensitive monomers so as to be incorporated into polymer chains during polymerization.

The selective irradiation producing the polymerization is preferably ultraviolet irradiation, but selective exposure to an electron or ion beam (to end up with the same result: namely an organometallic polymer) may also be envisioned.

Preferably, the organometallic compound is chosen from organometallic acrylates, organometallic methacrylates, organometallic styrenes and mixtures thereof. The polymer resulting from the irradiation is a homopolymer or copolymer of these monomers.

Apart from the fabrication process, the broad aspects of which have just been indicated, the invention also relates to an extreme ultraviolet photolithography mask operating in reflection, comprising a substrate, a reflecting structure uniformly deposited on the substrate, and an absorbent layer, which is absorbent at the operating wavelength of the mask, said layer being deposited on top of the reflecting structure and etched in a desired masking pattern, this mask being characterized in that the absorbent layer is an organometallic polymer containing a metal having a high absorption for the operating wavelength of the mask.

The invention is mainly applicable to what are called "binary" masks in which the pattern is defined simply by the strong absorption of the extreme ultraviolet rays in the zones comprising the absorbent layer and the strong reflection in the zones that do not comprise the absorbent layer. However, the invention is also applicable to what are called "attenuated phase shift" masks in which the pattern is defined not only by this difference in absorption but also by being increased in contrast due to the phase difference between the rays reflected in the absorbent zones and the rays reflected in the neighboring nonabsorbent zones.

It will be noted that organometallic compounds have already been used to form photosensitive resists that are particularly resistant to plasma etching, so that they can be used for etching subjacent layers requiring very aggressive plasma etchants. However, these resists have not been used as absorbent layers for producing reflection masks in which the resist itself forms absorbent islands at points where the mask must not be reflective. Patent U.S. Pat. No. 6,171,757 gives examples of such resists.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF DRAWINGS

The present invention is illustrated by way of example, and not by limitation, in the figures of the accompanying drawings, wherein elements having the same reference numeral designations represent like elements throughout and wherein:

FIG. 1 shows a mask of the prior art, of the binary type, operating in reflection; and FIGS. 2a to 2d show the principal steps, according to the invention, for manufacturing a mask operating in reflection.

DETAILED DESCRIPTION OF PREFERRED EMBODIMENTS

FIG. 1 shows a "binary" photolithography mask of the prior art operating in extreme ultraviolet reflection. It is made up of a planar substrate 10 covered with a continuous reflecting structure. The reflecting structure is a superposition of layers $c_1, c_2, \ldots c_n$ which are transparent at the extreme ultraviolet wavelength at which the mask will be used in reflection. The layers are alternating layers of different optical index and their thicknesses are chosen according to the indices and the operating wavelength so as to constitute a Bragg mirror having a high reflection coefficient at this wavelength.

The Bragg mirror thus formed is coated with an absorbent layer 20, which is absorbent at this wavelength and is etched in the desired masking pattern. This pattern is geometrically in a ratio greater than 1 (typically a ratio of 4) with the pattern that the mask will project during use onto a layer to be etched.

A buffer layer 22 is in principle provided between the absorbent layer and the reflecting structure. Said buffer layer possibly contributes to the absorption but it serves above all as an etch stop layer during photoetching of the absorbent layer.

In the prior art, the materials used as absorbent layer are typically metals such as titanium, tantalum, tungsten, chromium or aluminum, and also compounds of these metals such as tantalum silicide, titanium nitride and titanium-tungsten.

The thickness of the stack comprising the buffer layer and the absorbent layer is relatively large whenever it is desired to obtain a sufficient absorption (reflection less than 0.5%). For example, 70 nm of chromium on 90 nm of silica buffer layer is typically required.

This overall height is large and results in non-negligible shadowing effects: rays arriving obliquely at an angle of incidence (even when low) are masked over a lateral distance, to the detriment of resolution during use of the mask. For a given angle of incidence, the lateral shadowing distance is greater the higher the height of the stack.

The invention makes it possible, among other things, to reduce the height of the stack. FIGS. 2a to 2d show the fabrication steps for one example of a process for fabricating, according to the invention, an extreme ultraviolet mask operating in reflection.

The principal steps are the following:

deposition of a reflecting structure on a planar substrate 40, the structure being reflective at the operating wavelength of the extreme ultraviolet mask. The structure is a stack 42 of an alternation of transparent layers c1, c2, ... cn having different indices and thicknesses chosen according to the indices so as to constitute a reflecting structure of the Bragg mirror type (FIG. 2a). As an example, the layers are deposited by ion beam sputtering. Several tens of pairs of transparent layers, for example 40 pairs, are sputtered onto the substrate, each pair comprising for example a molybdenum layer and a silicon layer. The total thickness of each pair is about 6.9 nanometers for optimal reflection at a wavelength of about 13.8 nanometers. The reflection coefficient then exceeds 60% and may even reach 75%. The pairs of layers may also be molybdenum/beryllium or ruthenium/beryllium pairs and the substrate may be a silicon wafer or a glass or quartz plate 200 mm in diameter;

deposition (FIG. 2b), on the reflecting structure 42, of a uniform layer 46 of an organometallic monomer containing a metal having good absorption properties at the operating extreme ultraviolet wavelength (typically between 10 nm and 14 nm) of the mask. The metals used in the monomer are chosen from the following: Pt, Pd, Al, Ti, Y, Hf, Zr, Fe or several of these metals—the proportion of metal in the layer is from 10 to 90%;

irradiation of the layer 46, for example by electron bombardment Be (FIG. 2c) or by ion bombardment or by ultraviolet photons, depending on the type of monomer used. The ultraviolet radiation is in principle long-wavelength (190 to 350 nanometers) ultraviolet but short-wavelength ultraviolet, or even extreme ultraviolet, may also be used; and chemical development of the layer 46, polymerized just where it has been exposed, but not polymerized elsewhere, by removing the nonpolymerized zones and keeping the polymerized zones 50 constituting the absorbent zones of the reflection mask. The parts removed by the development leave the reflecting surface of the mirror structure 42 bare. FIG. 2d shows the finished reflection mask, which will reflect the extreme ultraviolet at the operating wavelengths of the Bragg mirror, except at the points where there are absorbent zones 50.

The monomers used in the fabrication process are chosen notably from the following: organometallic acrylates, methacrylates and styrenes or mixtures of these monomers. Examples of monomers are: 2-Mcenylethyl acrylate, 2-Mcenylmethyl acrylate, 2-(Mcenylmethyl-2-urethano)ethyl methacrylate and 4-Mcenylmethylstyrene, where M denotes the metal chosen from the metals indicated above. One method of preparing these compounds may be found in the patent U.S. Pat. No. 6,171,757.

The development of the photosensitive layer after exposure may be carried out using a solvent for the unirradiated monomers, for example ethyl 3-ethoxypropionate.

Thanks to the invention, it is now possible to use metals such as platinum as absorbent metal, which could not be used previously as they require too high a deposition temperature, not compatible with maintaining the quality of the multilayer reflecting structure. Now, by using these metals in the form of low-temperature monomer deposition, any deterioration is avoided.

Some of these materials, typically platinum, yttrium, hafnium and zirconium, have excellent absorption properties in the extreme ultraviolet ranging from 10 to 14 nm, and it then suffices to have a small thickness of absorbent layer in order to obtain sufficient absorption. The thickness may be around 40 nanometers, thereby reducing the shadowing effects at oblique incidence.

The invention results in a reduction in the costs of fabricating the mask owing to the fewer technological steps than those needed to fabricate the masks of the prior art. Furthermore, this process makes it possible:

to avoid depositing material for the buffer layer, since the step of etching the absorbent layer, as carried out in the prior art, is dispensed with;

to avoid steps that are difficult to control, in particular the steps of etching the absorbent stack; and to use materials having a high absorptivity in the extreme UV, materials which could not be used in the processes of the prior art.

The invention has been described in detail with regard to a binary mask, but it may also be used for producing an attenuated phase shift mask in which the absorbent layer not only plays the role of absorbent but also the role of phase shifting the light fraction that it reflects.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A process for fabricating an extreme ultraviolet photolithography mask operating in reflection, comprising:

depositing, on a substrate coated with a reflecting structure reflective at the operating wavelength of the mask, an absorption layer containing a metal having a high absorption coefficient for the wavelength; and etching the absorbent layer in a desired pattern so as to define a pattern of absorbent zones that are absorbent at the operating wavelength of the mask, wherein the deposited absorption layer is a layer of an organometallic compound sensitive to bombardment and containing the metal having a high absorption coefficient, and wherein the absorbent zones formed by the organometallic compound are polymerized after selective irradiation of the layer in these zones.

2. The process as claimed in claim 1, wherein the selective irradiation is carried out by photon, electron or ion bombardment.

3. The process as claimed in claim 1, wherein the metal is at least one metal selected from the group consisting of: platinum, palladium, yttrium, hafnium, zirconium and iron, and aluminum and titanium.

4. The process as claimed in claim 1, wherein the organometallic compound is chosen from organometallic acrylates, organometallic methacrylates, organometallic styrenes and mixtures thereof.

5. The process as claimed in claim 2, wherein the organometallic compound is chosen from organometallic acrylates, organometallic methacrylates, organometallic styrenes and mixtures thereof.

6. The process as claimed in claim 3, wherein the organometallic compound is chosen from organometallic acrylates, organometallic methacrylates, organometallic styrenes and mixtures thereof.

* * * * *